United States Patent
Jain et al.

(10) Patent No.: US 9,331,698 B2
(45) Date of Patent: May 3, 2016

(54) LEVEL SHIFTER CIRCUIT

(71) Applicants: Deependra K. Jain, Jabalpur (IN); Krishna Thakur, Gautam Budh Nagar (IN)

(72) Inventors: Deependra K. Jain, Jabalpur (IN); Krishna Thakur, Gautam Budh Nagar (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 291 days.

(21) Appl. No.: 14/146,721

(22) Filed: Jan. 2, 2014

(65) Prior Publication Data

US 2015/0188543 A1 Jul. 2, 2015

(51) Int. Cl.
*H03L 7/06* (2006.01)
*H03K 19/0175* (2006.01)
*H03L 7/085* (2006.01)
*H03K 5/156* (2006.01)
*H03L 7/099* (2006.01)

(52) U.S. Cl.
CPC ...... *H03K 19/017509* (2013.01); *H03K 5/1565* (2013.01); *H03L 7/085* (2013.01); *H03L 7/0995* (2013.01)

(58) Field of Classification Search
CPC .............................................. H03K 19/017509
USPC .................................................. 327/156–159
See application file for complete search history.

(56) References Cited

U.S. PATENT DOCUMENTS

| | | | |
|---|---|---|---|
| 5,912,574 A * | 6/1999 | Bhagwan | H03K 3/017 327/157 |
| 6,683,505 B2 | 1/2004 | West | |
| 7,009,424 B2 | 3/2006 | Khan et al. | |
| 7,053,722 B2 | 5/2006 | Rein | |
| 7,196,699 B1 * | 3/2007 | Kubota | G09G 3/3677 345/100 |
| 7,489,205 B2 | 2/2009 | Chatterjee | |
| 7,560,970 B2 | 7/2009 | Cook et al. | |
| 7,683,668 B1 | 3/2010 | Thakur et al. | |
| 7,777,522 B2 | 8/2010 | Yang et al. | |
| 7,791,422 B2 | 9/2010 | Lu | |
| 7,965,145 B2 | 6/2011 | Kim | |
| 8,198,916 B2 | 6/2012 | Sood et al. | |
| 8,350,592 B1 | 1/2013 | Malhan et al. | |
| 8,378,728 B1 | 2/2013 | Goyal et al. | |
| 8,432,189 B1 | 4/2013 | Malhan et al. | |
| 2009/0261873 A1 * | 10/2009 | Lin | H03L 7/0895 327/148 |

* cited by examiner

*Primary Examiner* — Sibin Chen
*Assistant Examiner* — Metasebia Retebo
(74) *Attorney, Agent, or Firm* — Charles E. Bergere

(57) ABSTRACT

A level shifter circuit for level shifting voltages of signals crossing multiple circuit domains includes an input stage and a driver stage. The input stage receives an oscillating signal generated by a ring oscillator and generates an inverted oscillating signal. The differential oscillating signals are provided to the driver stage, which level shifts a voltage level of the oscillating signal to a level of a supply voltage of the ring oscillator.

14 Claims, 4 Drawing Sheets

LEVEL SHIFTER CIRCUIT

BACKGROUND OF THE INVENTION

The present invention relates generally to digital circuits, and, more particularly, to a level shifter circuit.

Level shifters are used in integrated circuits that require level shifting voltages of signals that cross one or more circuit domains that operate at different voltage levels. Level shifters are commonly used in a phase-locked loop (PLL) to level shift the PLL output. A PLL includes a voltage-controlled oscillator (VCO) that generates an oscillating signal whose frequency is controlled by an input control voltage. The VCO includes a voltage-to-current converter and a current-controlled oscillator (CCO). The voltage-to-current converter converts the control voltage to a current input and the CCO generates the oscillating signal based on the current input.

A ring oscillator is the most commonly used CCO and has an odd number of cascade-connected inverters, for example, three cascade-connected inverters. Such a ring oscillator generates three oscillating signals that have a 120° phase difference. Each oscillating signal oscillates from zero to a voltage level equal to a top-node voltage of the VCO but less than a supply voltage $V_{dd}$ of the ring oscillator. A level shifter circuit is connected to the output of the VCO to level shift the voltage level of the oscillating signal to the supply voltage $V_{dd}$ to obtain a rail-to-rail output voltage.

FIG. 1A shows a schematic circuit diagram of a conventional system 100 that includes a ring oscillator 102 and a level shifter circuit 104. A current source 106, connected to a supply voltage $V_{dd}$, supplies an input current to the ring oscillator 102. The ring oscillator 102 includes first through third inverters N1-N3, each connected to a capacitor (not shown). The first through third inverters N1-N3 generate first through third oscillating signals PH1-PH3, each having a voltage level that is equal to a top-node voltage of the ring oscillator 102 and less than the supply voltage $V_{dd}$. The three oscillating signals PH1-PH3 further have phase differences of 120°.

The level shifter circuit 104 includes first through fourth transistors 108-114. Source terminals of the first and fourth transistors 108 and 114 are connected to ground. A drain terminal of the first transistor 108 is connected to a drain terminal of the second transistor 110. A gate terminal of the first transistor 108 receives the second oscillating signal PH2. A gate terminal of the second transistor 110 is connected to its drain terminal and a gate terminal of the third transistor 112. Source terminals of the second and third transistors 110 and 112 are connected to the supply voltage $V_{dd}$. A drain terminal of the third transistor 112 is connected to a drain terminal of the fourth transistor 114. A gate terminal of the fourth transistor 114 receives the first oscillating signal PH1. A level shifted output is obtained at the drain terminal of the fourth transistor 114. An inverter buffer 116 is connected to the drain terminal of the fourth transistor 114 to buffer the level shifted output.

FIG. 1B is a timing diagram illustrating the oscillating signals PH1-PH3. In operation, when the first oscillating signal PH1 is at low and the second oscillating signal PH2 is high (during time periods t4 to t6 of FIG. 1B), the fourth transistor 114 is switched off and the first transistor 108 is switched on. A drain current flows from the drain terminal to the source terminal of the first transistor 108, pulling down the voltage at its drain terminal to low and switching on the second transistor 110. A drain current flows from the source terminal to the drain terminal of the second transistor 110. The second and third transistors 110 and 112 form a current mirror causing the drain current to be mirrored to the third transistor 112. An output signal is obtained at the drain terminal of the third transistor 112 that is at a voltage level equal to the supply voltage $V_{dd}$. Thus, the input to the level shifter circuit 104 is level shifted from the top-node voltage to the supply voltage $V_{dd}$ (from t4 to t6 of FIG. 1B), i.e., when the oscillating signals PH1 and PH2 are complementary. The operation is similar when the first oscillating signal PH1 is high and the second oscillating signal PH2 is low.

However, from time t0 to t1, the first and second oscillating signals PH1 and PH2 both are high and from time t3 to t4, both the first and second oscillating signals PH1 and PH2 are low, as shown in FIG. 1B. When the level shifter circuit 104 does not receive complementary inputs, it does not provide rail-to-rail output, i.e., it fails to shift the voltage level to $V_{dd}$. Such a distorted output hampers the duty cycle of the level shifter circuit 104 output signal.

Therefore, it would be advantageous to have a level shifter circuit that maintains the duty cycle of the oscillating signals input to the level shifter circuit, obtains rail-to-rail output voltage, and improves performance of the conventional level shifter circuit.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1A:
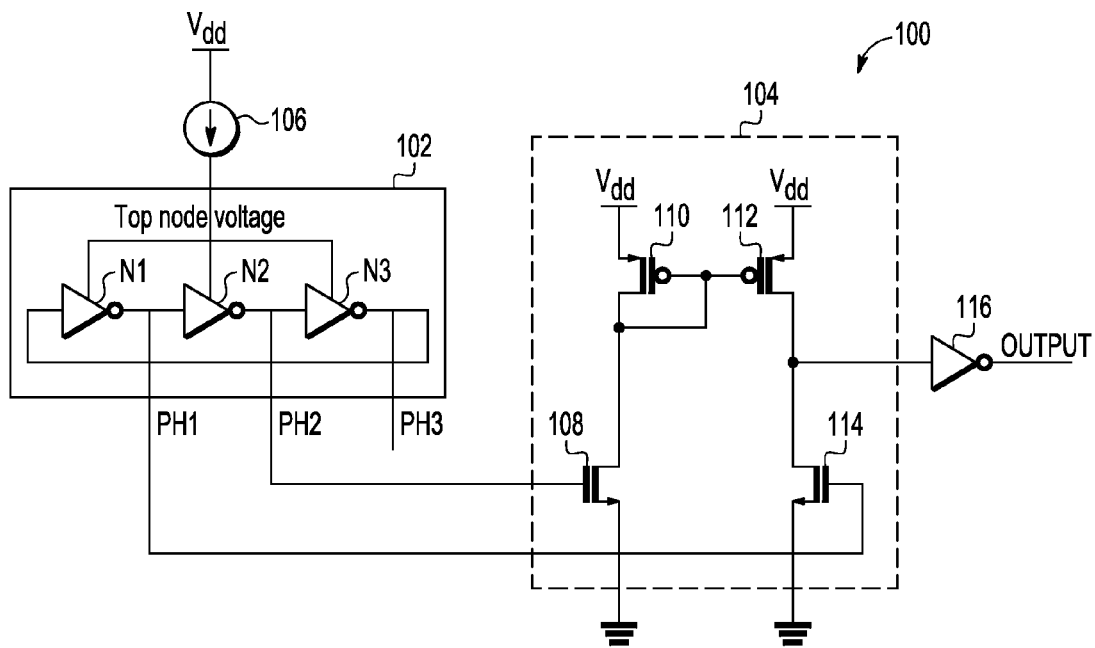
FIG. 1A is a schematic circuit diagram of a conventional system that includes a ring oscillator and a level shifter circuit.
Figure 1B:
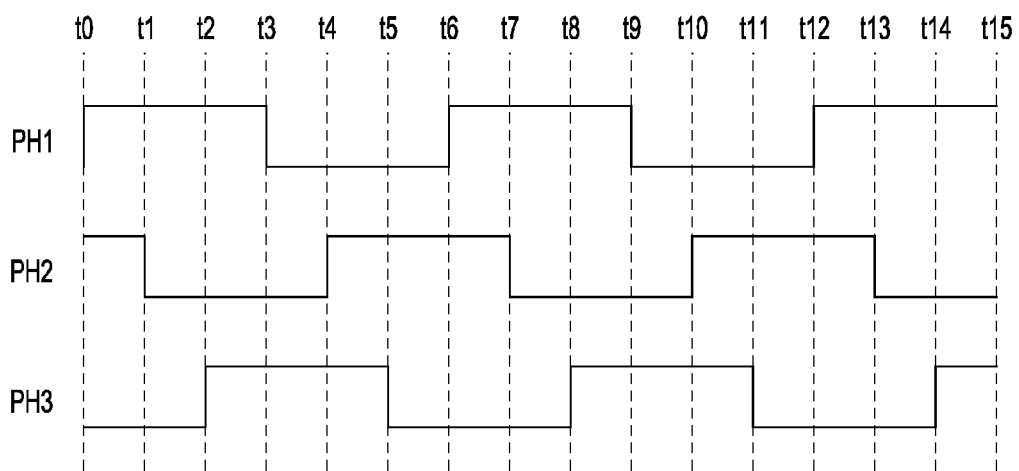
FIG. 1B is a timing diagram illustrating a plurality of oscillating signals generated by the conventional system of FIG. 1A.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention a level shifter circuit is provided. The level shifter circuit generates an output voltage based on an input voltage. The level shifter circuit includes an input stage that generates an inverted input voltage. The input stage includes: a first transistor having a gate terminal for receiving a first supply voltage and a source terminal connected to ground; a second transistor having a drain terminal connected to a gate terminal thereof and a drain terminal of the first transistor and a source terminal for receiving a second supply voltage; a third transistor having a gate terminal connected to the gate terminal of the second transistor and a source terminal for receiving the second supply voltage; a fourth transistor having a drain terminal connected to a gate terminal thereof and a drain terminal of the third transistor and a source terminal connected to ground; and a fifth transistor having a gate terminal for receiving the input voltage, a drain terminal connected to the gate terminal of the fourth transistor, and a source terminal connected to ground.

The inverted input voltage is generated at the drain terminal of the fifth transistor. The level shifter circuit further includes a driver stage connected to the input stage that level shifts the input voltage from the first supply voltage to the output voltage. The driver stage includes: a sixth transistor having a gate terminal connected to the gate and drain terminals of the fourth and fifth transistors, respectively, and a source terminal connected to ground; a seventh transistor having a drain terminal connected to its gate terminal and a drain terminal of the sixth transistor and a source terminal for receiving the second supply voltage; an eighth transistor having a gate terminal connected to the gate terminal of the seventh transistor and a source terminal for receiving the second supply voltage; and a ninth transistor having a gate terminal for receiving the input voltage, a source terminal connected to ground, and a drain terminal connected to a drain terminal of the eighth transistor for outputting the output voltage. The output voltage is at a level of the second supply voltage.

In another embodiment of the present invention, a voltage-controlled oscillator (VCO) is provided. The VCO includes a voltage-to-current converter that receives an input voltage and generates an output current. The VCO further includes a CCO connected to the voltage-to-current converter. The CCO includes a plurality of inverters that receive the output current and generate corresponding plurality of oscillating signals by way of corresponding top-node voltages. The plurality of oscillating signals have a predetermined phase difference therebetween and each oscillating signal has a voltage level equal to the top-node voltage. The VCO further includes a level shifter circuit connected to the CCO. The level shifter circuit receives a first oscillating signal of the plurality of oscillating signals and level shifts a voltage level of the first oscillating signal from the top-node voltage to an output voltage. The level shifter circuit includes an input stage for generating an inverted first oscillating signal. The input stage includes: a first transistor having a gate terminal for receiving the top-node voltage and a source terminal connected to ground; a second transistor having a drain terminal connected to a gate terminal thereof and a drain terminal of the first transistor and a source terminal for receiving a supply voltage; a third transistor having a gate terminal connected to the gate terminal of the second transistor and a source terminal for receiving the supply voltage; a fourth transistor having a drain terminal connected to a gate terminal thereof and a drain terminal of the third transistor and a source terminal connected to ground; and a fifth transistor having a gate terminal for receiving the first oscillating signal, a drain terminal connected to the gate terminal of the fourth transistor, and a source terminal connected to ground. The inverted first oscillating signal is generated at the drain terminal of the fifth transistor. The level shifter circuit further includes a driver stage connected to the input stage. The driver stage generates the output voltage. The driver stage includes: a sixth transistor having a gate terminal connected to the gate and drain terminals of the fourth and fifth transistors, respectively, and a source terminal connected to ground; a seventh transistor having a drain terminal connected to a gate terminal thereof and a drain terminal of the sixth transistor and a source terminal for receiving the supply voltage; an eighth transistor having a gate terminal connected to the gate terminal of the seventh transistor and a source terminal for receiving the supply voltage; and a ninth transistor having a gate terminal for receiving the first oscillating signal, a source terminal connected to ground, and a drain terminal connected to a drain terminal of the eighth transistor for outputting the output voltage. The output voltage is at a level of the supply voltage.

In yet another embodiment, a phase-locked loop (PLL) is provided. The PLL includes a voltage-controlled oscillator (VCO) that generates a plurality of oscillating signals. The VCO includes a voltage-to-current converter that receives an input voltage and generates an output current. The VCO further includes a CCO connected to the voltage-to-current converter. The CCO includes a plurality of inverters that receive the output current and generate corresponding plurality of oscillating signals by way of corresponding top-node voltages. The plurality of oscillating signals have a predetermined phase difference therebetween and each oscillating signal has a voltage level equal to the top-node voltage. The VCO further includes a level shifter circuit connected to the CCO. The level shifter circuit receives a first oscillating signal of the plurality of oscillating signals and level shifts a voltage level of the first oscillating signal from the top-node voltage to an output voltage. The level shifter circuit includes an input stage for generating an inverted first oscillating signal. The input stage includes: a first transistor having a gate terminal for receiving the top-node voltage and a source terminal connected to ground; a second transistor having a drain terminal connected to a gate terminal thereof and a drain terminal of the first transistor and a source terminal for receiving a supply voltage; a third transistor having a gate terminal connected to the gate terminal of the second transistor and a source terminal for receiving the supply voltage; a fourth transistor having a drain terminal connected to a gate terminal thereof and a drain terminal of the third transistor and a source terminal connected to ground; and a fifth transistor having a gate terminal for receiving the first oscillating signal, a drain terminal connected to the gate terminal of the fourth transistor, and a source terminal connected to ground. The inverted first oscillating signal is generated at the drain terminal of the fifth transistor. The level shifter circuit further includes a driver stage connected to the input stage. The driver stage generates the output voltage. The driver stage includes: a sixth transistor having a gate terminal connected to the gate and drain terminals of the fourth and fifth transistors, respectively, and a source terminal connected to ground; a seventh transistor having a drain terminal connected to a gate terminal thereof and a drain terminal of the sixth transistor and a source terminal for receiving the supply voltage; an eighth transistor having a gate terminal connected to the gate terminal of the seventh transistor and a source terminal for receiving the supply voltage; and a ninth transistor having a gate terminal for receiving the first oscillating signal, a source terminal connected to ground, and a drain terminal connected to a drain terminal of the eighth transistor for outputting the output voltage. The output voltage is at a level of the supply voltage.

Various embodiments of the present invention provide a level shifter circuit that includes an input stage and a driver stage. The level shifter circuit is connected to a current-controlled oscillator (CCO) that generates a plurality of oscillating signals. The plurality of oscillating signals have a predetermined phase difference, such as 120 degrees, therebetween and a voltage level equal to a top-node voltage of the CCO and less than a supply voltage. The input stage includes first through fifth transistors and the driver stage includes sixth through ninth transistors. Source terminals of the first, fourth, fifth, sixth, and ninth transistors are connected to ground. Source terminals of the second, third, seventh, and eighth transistors are connected to the supply voltage. The top-node voltage is received at a gate terminal of the first transistor and switches on the first transistor. The second transistor is switched on and a drain current flows from the source terminal to the drain terminal thereof. The second and third transistors form a current mirror causing the drain current to be mirrored to the third transistor. The fourth transistor is switched on and conducts the drain current flowing by way of the third transistor. The fifth transistor receives a first oscillating signal of the plurality of oscillating signals. When the first oscillating signal is at a logic high state, the fifth transistor is switched on and an output at a drain terminal thereof switches to a logic low state. When the first oscillating signal is at the logic low state, the fifth transistor is switched off and an output at the drain terminal thereof switches to the logic high state. Thus, an inverted oscillating signal is generated by the input stage. The first oscillating signal is also received as an input by a gate terminal of the ninth transistor. Therefore, a differential input is received by the driver stage of the level shifter circuit. Thus, the driver stage efficiently level shifts the output voltage to the supply voltage as compared to a conventional level shifter circuit that generates a distorted level shifted output voltage. Thus, the level shifter circuit of the present invention obtains rail-to-rail output voltage (equal to the supply voltage) and has an improved performance compared to the conventional level shifter circuit and further preserves a duty cycle of the first oscillating signal.

Figure 2:
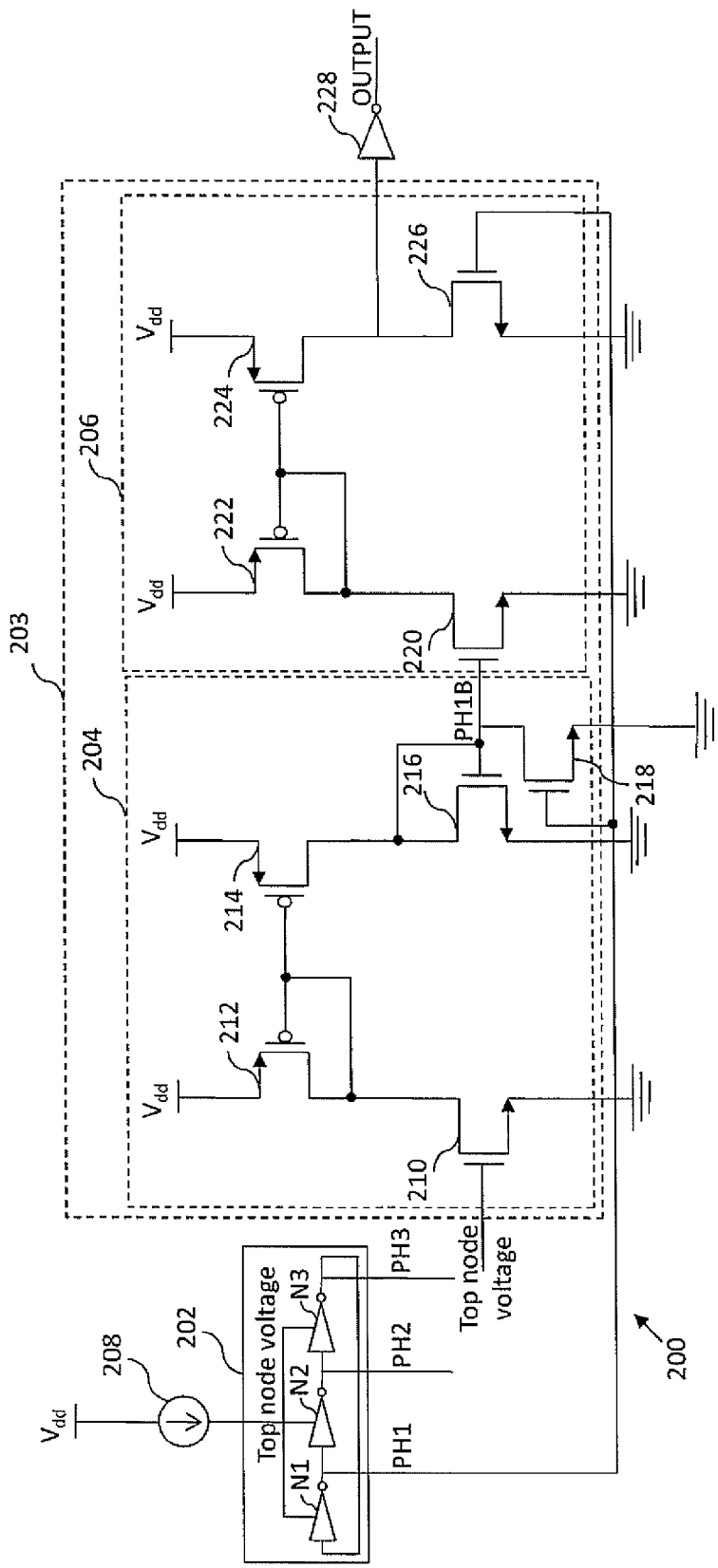
FIG. 2 is a schematic circuit diagram of a system that includes a ring oscillator and a level shifter circuit in accordance with an embodiment of the present invention.

Referring now to FIG. 2, a schematic circuit diagram showing a system 200 in accordance with an embodiment of the present invention is shown. The system 200 includes a ring oscillator 202 and a level shifter circuit 203. The level shifter circuit 203 includes an input stage 204 and a driver stage 206. A current source 208, connected to a supply voltage $V_{dd}$, supplies input current to the ring oscillator 202. The input stage 204 includes first through fifth transistors 210-218 and the driver stage includes sixth through ninth transistors 220-226.

The ring oscillator 202 includes first through third cascade-connected inverters N1-N3, each connected to a capacitor (not shown). It will be appreciated by those of skill in art that the ring oscillator 202 may include any odd number of cascade-connected inverters. The ring oscillator 202 generates first through third oscillating signals PH1-PH3, each having a predetermined phase difference, such as 120 degrees, therebetween and a voltage level equal to a top-node voltage that is less than a supply voltage $V_{dd}$. It will be understood by those of skill in the art that the phase difference between the oscillating signals PH1, PH2, and PH3 may be different than 120 degrees.

A source terminal of the first transistor 210 is connected to ground and a gate terminal thereof receives a constant supply voltage equal to the top-node voltage as an input. A drain terminal of the second transistor 212 is connected to a gate terminal thereof and a drain terminal of the first transistor 210. The gate terminal of the second transistor 212 is connected to a gate terminal of the third transistor 214. Source terminals of the second and third transistors, 212 and 214, are connected to the supply voltage $V_{dd}$. A drain terminal of the fourth transistor 216 is connected to its gate terminal and a drain terminal of the third transistor 214. A source terminal of the fourth transistor 216 is connected to ground and the gate terminal of the fourth transistor 216 is connected to a drain terminal of the fifth transistor 218. A source terminal of the fifth transistor 218 is connected to ground and a gate terminal thereof receives the first oscillating signal PH1 as an input.

A source terminal of the sixth transistor 220 is connected to ground and a gate terminal thereof is connected to the drain terminal of the fifth transistor 218. A drain terminal of the seventh transistor 222 is connected to a gate terminal thereof and a drain terminal of the sixth transistor 220. The gate terminal of the seventh transistor 222 is connected to a gate terminal of the eighth transistor 224. Source terminals of the seventh and eighth transistors, 222 and 224, are connected to the supply voltage $V_{dd}$. A drain terminal of the eighth transistor 224 is connected to a drain terminal of the ninth transistor 226. A source terminal of the ninth transistor 226 is connected to ground and a gate terminal thereof receives the first oscillating signal PH1 as an input. A level shifted oscillating signal is obtained at the drain terminal of the ninth transistor 226. A buffer 228 is connected at the drain terminal of the ninth transistor 226 to buffer the level shifted oscillating signal.

In operation, since the gate terminal of the first transistor 210 receives the constant supply voltage equal to the top-node voltage, the first transistor 210 is switched on and a drain current flows from the drain terminal to the source terminal thereof. A voltage at the drain terminal of the first transistor 210 is pulled down to a logic low. The second transistor 212 is switched on and the drain current flows from the source terminal to its drain terminal. The second transistor 212 and the third transistor 214 form a current mirror causing the drain current to be mirrored to the third transistor 214. A voltage at the drain terminal of the third transistor 214 is pulled up to a logic high state. The fourth transistor 216 is switched on and the drain current flows from the drain terminal to the source terminal thereof. As the first through fourth transistors 210-216 are matched, an output obtained at the drain terminal of the fourth transistor 216 is at the same voltage level as the input to the gate terminal of the first transistor 210, i.e., the top-node voltage of the ring oscillator 202. Since the drain terminal of the fourth transistor 216 is connected to its gate terminal, the voltage at the gate terminal thereof is at the top-node voltage level.

Figure 3:
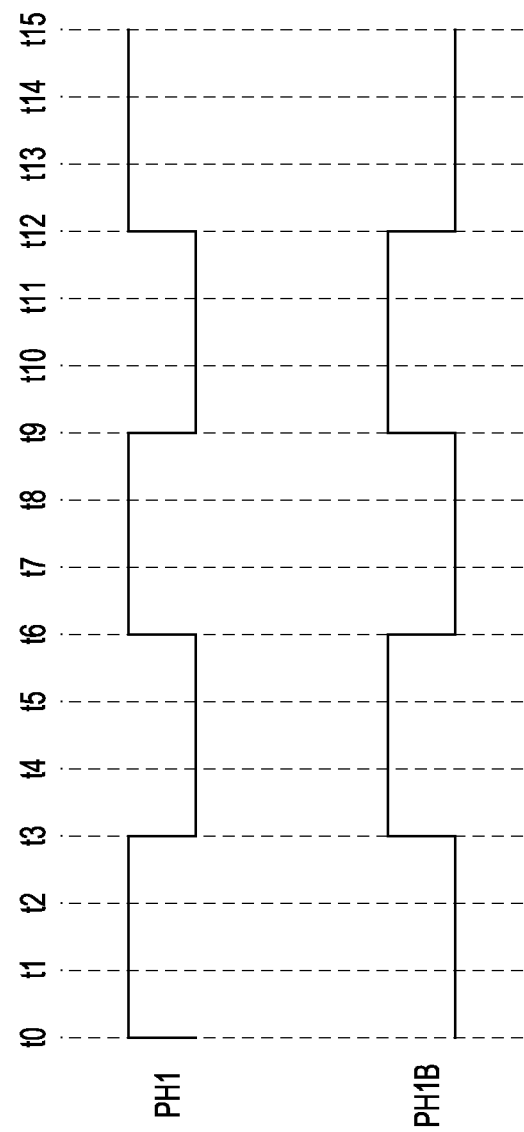
FIG. 3 is a timing diagram illustrating a plurality of oscillating signals generated by the system of FIG. 2 in accordance with an embodiment of the present invention.

In one embodiment, when the first oscillating signal PH1 is at the logic high state, the fifth transistor 218 is switched on and an output at the drain terminal thereof is pulled down to the logic low state. In another embodiment, when the first oscillating signal PH1 is at the logic low, the fifth transistor 218 is switched off and the output at its drain terminal is at the top-node voltage level i.e. logic high. Thus, an inverted first oscillating signal PH1B is obtained at the output of the input stage 204, as shown in FIG. 3.

The sixth through ninth transistors 220-226 correspond to the first through fourth transistors 102-108 of the level shifter circuit 104 of the system 100 of FIG. 1A and operate similarly. The inverted first oscillating signal PH1B, obtained at the output of the input stage 204, is provided as an input to the gate terminal of the sixth transistor 220 and the gate terminal of the ninth transistor 226 receives the first oscillating signal PH1 as the input, i.e., the driver stage 206 receives differential input signals. Thus, the driver stage 206 efficiently level shifts the output voltage to the supply voltage $V_{dd}$ and preserves a duty cycle of the first oscillating signal PH1.

Figure 4:
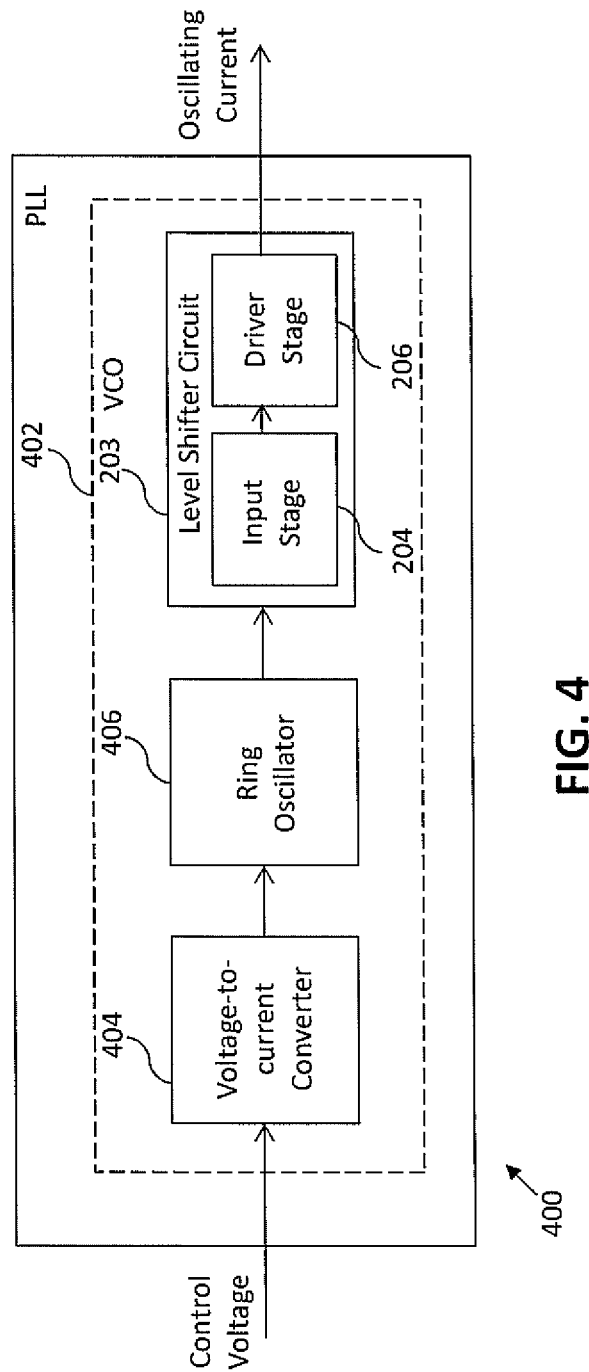
FIG. 4 is a schematic block diagram of a phase-locked loop (PLL) in accordance with an embodiment of the present invention.

Referring now to FIG. 4, a schematic block diagram of a phase-locked loop (PLL) 400 in accordance with the present invention is shown. The PLL 400 includes a voltage-controlled oscillator (VCO) 402. The VCO 402 further includes a voltage-to-current converter 404, a ring oscillator 406, and a level shifter circuit 203. The voltage-to-current converter 404 receives a control voltage and generates a control current.

The control current is input to the ring oscillator 406. The ring oscillator 406 generates first through third oscillating signals PH1-PH3 that have a phase difference of 120 degrees therebetween. The level shifter circuit 203 receives a first oscillating signal PH1 and the input stage 204 generates an inverted first oscillating signal PH1B, by way of which the driver stage 206 efficiently level shifts a voltage level of the first oscillating signal PH1 to a supply voltage level $V_{dd}$.

In an embodiment of the present invention, the first, fourth, fifth, sixth and ninth transistors are n-channel metal-oxide semiconductor (NMOS) transistors and the second, third, seventh and eighth transistors are p-channel metal-oxide semiconductor (PMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A level-shifter circuit for generating an output voltage based on an input voltage, comprising:
   an input stage for generating an inverted input voltage, wherein the input stage includes:
      a first transistor having a gate terminal for receiving a first supply voltage and a source terminal connected to ground;
      a second transistor having a drain terminal connected to a gate terminal thereof and a drain terminal of the first transistor and a source terminal for receiving a second supply voltage;
      a third transistor having a gate terminal connected to the gate terminal of the second transistor and a source terminal for receiving the second supply voltage;
      a fourth transistor having a drain terminal connected to a gate terminal thereof and a drain terminal of the third transistor and a source terminal connected to ground; and
      a fifth transistor having a gate terminal for receiving the input voltage, a drain terminal connected to the gate terminal of the fourth transistor, and a source terminal connected to ground, wherein the inverted input voltage is generated at the drain terminal thereof; and
   a driver stage, connected to the input stage, for level shifting the input voltage that is at a level of the first supply voltage to the output voltage, wherein the driver stage includes:
      a sixth transistor having a gate terminal connected to the gate and drain terminals of the fourth and fifth transistors, respectively, and a source terminal connected to ground;
      a seventh transistor having a drain terminal connected to a gate terminal thereof and a drain terminal of the sixth transistor and a source terminal for receiving the second supply voltage;
      an eighth transistor having a gate terminal connected to the gate terminal of the seventh transistor and a source terminal for receiving the second supply voltage; and
      a ninth transistor having a gate terminal for receiving the input voltage, a source terminal connected to ground, and a drain terminal connected to a drain terminal of the eighth transistor for outputting the output voltage, wherein the output voltage is at a level of the second supply voltage.

2. The level-shifter circuit of claim 1, wherein the first, fourth, fifth, sixth, and ninth transistors are n-channel metal-oxide semiconductor (NMOS) transistors.

3. The level-shifter circuit of claim 1, wherein the second, third, seventh, and eighth transistors are p-channel metal-oxide semiconductor (PMOS) transistors.

4. The level-shifter circuit of claim 1, further comprising an inverter connected to the drain terminal of the ninth transistor for buffering the output voltage.

5. A voltage-controlled oscillator (VCO), comprising:
   a voltage-to-current converter, for receiving an input voltage and generating an output current;
   a current-controlled ring oscillator, connected to the voltage-to-current converter, wherein the current-controlled ring oscillator includes a plurality of inverters that receive the output current and generate corresponding plurality of oscillating signals by using a top-node voltage of the current-controlled ring oscillator, wherein the plurality of oscillating signals have a predetermined phase difference therebetween and each oscillating signal has a voltage level that is equal to the top-node voltage; and
   a level-shifter circuit, connected to the current-controlled ring oscillator, for receiving a first oscillating signal of the plurality of oscillating signals and level shifting a voltage level of the first oscillating signal from the top-node voltage to an output voltage, wherein the level-shifter circuit comprises:
      an input stage for generating an inverted first oscillating signal, wherein the input stage includes:
         a first transistor having a gate terminal for receiving the top-node voltage and a source terminal connected to ground;
         a second transistor having a drain terminal connected to a gate terminal thereof and a drain terminal of the first transistor and a source terminal for receiving a supply voltage;
         a third transistor having a gate terminal connected to the gate terminal of the second transistor and a source terminal for receiving the supply voltage;
         a fourth transistor having a drain terminal connected to a gate terminal thereof and a drain terminal of the third transistor and a source terminal connected to ground; and
         a fifth transistor having a gate terminal for receiving the first oscillating signal, a drain terminal connected to the gate terminal of the fourth transistor, and a source terminal connected to ground, wherein the inverted first oscillating signal is generated at the drain terminal thereof; and
      a driver stage, connected to the input stage, for generating the output voltage, wherein the driver stage includes:
         a sixth transistor having a gate terminal connected to the gate and drain terminals of the fourth and fifth transistors, respectively, and a source terminal connected to ground;
         a seventh transistor having a drain terminal connected to a gate terminal thereof and a drain terminal of the sixth transistor and a source terminal for receiving the supply voltage;
         an eighth transistor having a gate terminal connected to the gate terminal of the seventh transistor and a source terminal for receiving the supply voltage; and
         a ninth transistor having a gate terminal for receiving the first oscillating signal, a source terminal connected to ground, and a drain terminal connected to a drain terminal of the eighth transistor for outputting the output voltage, wherein the output voltage is at a level of the supply voltage.

6. The VCO of claim 5, wherein the first, fourth, fifth, sixth, and ninth transistors are n-channel metal-oxide semiconductor (NMOS) transistors.

7. The VCO of claim 5, wherein the second, third, seventh, and eighth transistors are p-channel metal-oxide semiconductor (PMOS) transistors.

8. The VCO of claim 5, further comprising an inverter, connected to the drain terminal of the ninth transistor, for buffering the output voltage.

9. The VCO of claim 5, wherein the predetermined phase difference is 120 degrees.

10. A phase-locked loop (PLL), comprising:
a voltage-controlled oscillator (VCO) for generating a plurality of oscillating signals, wherein the VCO comprises:
 a voltage-to-current converter, for receiving an input voltage and generating an output current;
 a current-controlled ring oscillator, connected to the voltage-to-current converter, wherein the current-controlled ring oscillator includes a plurality of inverters that receive the output current and generate the corresponding plurality of oscillating signals by using a top-node voltage of the current-controlled ring oscillator, wherein the plurality of oscillating signals have a predetermined phase difference therebetween and each oscillating signal has a voltage level equal to the top-node voltage; and
 a level-shifter circuit, connected to the current-controlled ring oscillator, for receiving a first oscillating signal of the plurality of oscillating signals and level shifting a voltage level of the first oscillating signal from the top-node voltage to an output voltage, wherein the level-shifter circuit comprises:
  an input stage for generating an inverted first oscillating signal, wherein the input stage includes:
   a first transistor having a gate terminal for receiving the top-node voltage and a source terminal connected to ground;
   a second transistor having a drain terminal connected to a gate terminal thereof and a drain terminal of the first transistor and a source terminal for receiving a supply voltage;
   a third transistor having a gate terminal connected to the gate terminal of the second transistor and a source terminal for receiving the supply voltage;
   a fourth transistor having a drain terminal connected to a gate terminal thereof and a drain terminal of the third transistor and a source terminal connected to ground; and
   a fifth transistor having a gate terminal for receiving the first oscillating signal, a drain terminal connected to the gate terminal of the fourth transistor, and a source terminal connected to ground, wherein the inverted first oscillating signal is generated at the drain terminal thereof; and
  a driver stage, connected to the input stage, for generating the output voltage, wherein the driver stage includes:
   a sixth transistor having a gate terminal connected to the gate and drain terminals of the fourth and fifth transistors, respectively, and a source terminal connected to ground;
   a seventh transistor having a drain terminal connected to a gate terminal thereof and a drain terminal of the sixth transistor and a source terminal for receiving the supply voltage;
   an eighth transistor having a gate terminal connected to the gate terminal of the seventh transistor and a source terminal for receiving the supply voltage; and
   a ninth transistor having a gate terminal for receiving the first oscillating signal, a source terminal connected to ground, and a drain terminal connected to a drain terminal of the eighth transistor for outputting the output voltage, wherein the output voltage is at a level of the supply voltage.

11. The PLL of claim 10, wherein the first, fourth, fifth, sixth, and ninth transistors are n-channel metal-oxide semiconductor (NMOS) transistors.

12. The PLL of claim 10, wherein the second, third, seventh, and eighth transistors are p-channel metal-oxide semiconductor (PMOS) transistors.

13. The PLL of claim 10, further comprising an inverter, connected to the drain terminal of the ninth transistor, for buffering the output voltage.

14. The PLL of claim 10, wherein the predetermined phase difference is 120 degrees.

* * * * *